United States Patent
Jin

(10) Patent No.: US 11,664,234 B2
(45) Date of Patent: May 30, 2023

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Jisong Jin, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 17/032,390

(22) Filed: Sep. 25, 2020

(65) Prior Publication Data
US 2021/0159081 A1   May 27, 2021

(30) Foreign Application Priority Data
Nov. 26, 2019   (CN) .......................... 201911176061.2

(51) Int. Cl.
*H01L 21/308* (2006.01)
(52) U.S. Cl.
CPC ...... *H01L 21/3088* (2013.01); *H01L 21/3081* (2013.01); *H01L 21/3085* (2013.01); *H01L 21/3086* (2013.01)

(58) Field of Classification Search
None
See application file for complete search history.

(56) References Cited

U.S. PATENT DOCUMENTS

| | | | |
|---|---|---|---|
| 10,685,838 B1 * | 6/2020 | Shiliang | H01L 21/0276 |
| 2014/0138800 A1 * | 5/2014 | He | H01L 21/0337 |
| | | | 257/632 |
| 2017/0294310 A1 * | 10/2017 | Tapily | H01L 21/0332 |
| 2020/0279748 A1 * | 9/2020 | Zhang | H01L 21/3088 |
| 2021/0035803 A1 * | 2/2021 | Junhong | H01L 21/0337 |
| 2021/0159078 A1 * | 5/2021 | Zhang | H01L 21/0337 |

* cited by examiner

Primary Examiner — Allan W. Olsen
(74) Attorney, Agent, or Firm — Anova Law Group, PLLC

(57) ABSTRACT

Semiconductor structures and fabrication methods are provided. An exemplary fabrication method includes providing a to-be-etched layer; forming a first sacrificial film on the to-be-etched layer; and forming a plurality of discrete first sidewall spacers and sidewall trenches on the first sacrificial film. Each sidewall trench is located between two adjacent first sidewall spacers; the first sidewall trenches include a first sidewall trench and a second sidewall trench, and a width of the second sidewall trench is greater than that of the first sidewall trench. The method also includes forming a second sidewall spacer in the first sidewall trench to fill the first sidewall trench; and etching the first sacrificial film using the first sidewall spacers and the second sidewall spacer as an etching mask to form a plurality of discrete first sacrificial layers on the to-be-etched layer.

19 Claims, 7 Drawing Sheets

SEMICONDUCTOR STRUCTURE AND FABRICATION METHOD THEREOF

CROSS-REFERENCE TO RELATED APPLICATION

This application claims the priority of Chinese patent application No. 201911176061.2, filed on Nov. 26, 2019, the entirety of which is incorporated herein by reference.

FIELD OF THE DISCLOSURE

The present disclosure generally relates to the field of semiconductor manufacturing technology and, more particularly, relates to semiconductor structures and fabrication methods.

BACKGROUND

In the process of manufacturing semiconductor devices, a photolithography process is usually used to transfer patterns from a mask to a substrate. The photolithography process usually includes providing a semiconductor substrate; forming a photoresist layer on the semiconductor substrate; and exposing and developing the photoresist layer to form a patterned photoresist layer to allow the patterns on the mask to be transferred to the photoresist layer. The semiconductor substrate is etched using the patterned photoresist layer as an etching mask such that the patterns on the patterned photoresist layer are transferred to the semiconductor substrate. After transferring the patterns to the semiconductor substrate, the patterned photoresist layer may be removed.

As the size of semiconductor devices continues to shrink, the critical dimensions of the lithography process are gradually approaching or even exceeding the physical limits of photolithography, which poses more severe challenges to the lithography technology. To further reduce the size of semiconductor devices on the basis of the photolithography process, a multiple patterning process has been developed. Such a process has application prospects because of its ability to form a mask with a smaller size, and the unreachable limit of a single patterning process may be overcome.

However, after transferring patterns using the multiple patterning process, the patterns still need to be further processed. Thus, the production time and cost are increased. The disclosed methods and semiconductor structures are directed to solve one or more problems set forth above and other problems in the art.

BRIEF SUMMARY OF THE DISCLOSURE

One aspect of the present disclosure includes providing a method for forming a semiconductor structure. The method may include providing a to-be-etched layer; forming a first sacrificial film on the to-be-etched layer; and forming a plurality of discrete first sidewall spacers and a plurality of sidewall trenches on the first sacrificial film. Each of the plurality of sidewall trenches is located between two adjacent first sidewall spacers of the plurality of discrete first sidewall spacers; the plurality of first sidewall trenches include a first sidewall trench and a second sidewall trench; and a width of the second sidewall trench is greater than a width of the first sidewall trench. The method may also include forming a second sidewall spacer in the first sidewall trench to fill the first sidewall trench; and etching the first sacrificial film using the plurality of first sidewall spacers and the second sidewall spacer as an etching mask to form a plurality of discrete first sacrificial layers on the to-be-etched layer.

Optionally, the to-be-etched layer includes a multiple-layer structure, the multiple layer structure includes a substrate, a mask structure on the substrate and a first stop layer on the mask structure.

Optionally, the method for forming the plurality of first sidewall spacers may include forming a second stop layer on the first sacrificial film; and forming a plurality of discrete second sacrificial layers and a plurality of sacrificial layer trenches on the second stop layer. Each second sacrificial layer trench of the plurality of sacrificial layer trenches is located between two adjacent second sacrificial layers of the plurality of discrete second sacrificial layers; the plurality of sacrificial layer trenches include a first sacrificial layer trench and a second sacrificial layer trench; and a width of the second sacrificial layer trench is greater than a width of the first sacrificial layer trench. The method may also include forming a first sidewall spacer on a sidewall surface of a second sacrificial layer of the plurality of discrete second sacrificial layers; and removing the plurality of discrete second sacrificial layers after forming the first sidewall spacer.

Optionally, the method for forming the first sidewall spacer on the sidewall surface of the second sacrificial layer may include forming a first sidewall film on exposed portions of a top surface of the second stop layer, and sidewall surfaces and top surfaces of the plurality of discrete second sacrificial layers; etching-back the first sidewall film on the exposed portions of the top surface of the second stop layer and the top surfaces of the plurality of discrete second sacrificial layers until the exposed portions of the top surface of the second stop layer and the top surfaces of the plurality of discrete second sacrificial layers are exposed to form the first sidewall spacer of the sidewall surface of the second sacrificial layer.

Optionally, a ratio between the width of the first sacrificial layer trench and a thickness of the first sidewall spacer is greater than 2:1; and a ratio between the width of the second sacrificial layer trench and the thickness of the first sidewall spacer is greater than 2:1.

Optionally, forming the first sidewall film includes an atomic layer deposition process.

Optionally, etching back the first sidewall film includes one of an anisotropic dry etching process or an anisotropic wet etching process.

Optionally, a material of the first sidewall film includes one of silicon nitride and silicon oxynitride.

Optionally, the method for forming the plurality of discrete second sacrificial layers may include forming a second sacrificial film on the second stop layer; forming a plurality of discrete patterned structures on the second sacrificial film; etching the second sacrificial film using the plurality of discrete patterned structures as an etching mask until the second stop layer is exposed to form the plurality of discrete second sacrificial layers; and removing the plurality of discrete patterned structures after forming the plurality of discrete second sacrificial layers.

Optionally, the method for forming the second sidewall spacer may include forming a second sidewall film on exposed portions of a top surface of the second stop layer and sidewall surfaces and top surfaces of the first sidewall spacers; and etching the second sidewall film on surfaces of the second sidewall trenches and the top surfaces of the first sidewall spacers until the top surface of the second stop layer and the top surfaces of the first sidewall spacers are exposed to form the second sidewall spacer.

Optionally, a ratio between the width of the first sidewall trench and a thickness of the second sidewall spacer is smaller than 2:1; and a ratio between the width of the second sidewall trench and the thickness of the second sidewall spacer is greater than 2:1.

Optionally, forming the second sidewall film may include an atomic layer deposition process.

Optionally, etching the second sidewall film includes one of an anisotropic dry etching process or an isotropic wet etching process.

Optionally, a material of the second sidewall film includes silicon carbonitride.

Optionally, after forming the plurality of first sacrificial layers, the method may also include removing the second sidewall spacer and the first sidewall spacers.

Optionally, the method may also include forming third sidewall spacers. The method for forming the third sidewall spacers on the sidewall surfaces of the plurality of first sacrificial layers may include forming a third sidewall film on exposed portions of a top surface of the to-be-etched layer, and sidewall surfaces and top surfaces of the plurality of first sacrificial layers; etching back the third sidewall film on the exposed portions of the top surface of the to-be-etched layer and the top surfaces of the first sacrificial layers until the exposed portions of the top surface of the to-be-etched layer and the top surfaces of the first sacrificial layers are exposed to form the third sidewall spacers; and removing the plurality of first sacrificial layers after forming the third sidewall spacers.

Optionally, forming the third sidewall film may include an atomic layer deposition process.

Optionally, a material of the third sidewall film may include one of silicon nitride and silicon oxynitride.

Optionally, after forming the third sidewall spacers, the method may further include forming a plurality of discrete fins by etching the to-be-etched layer using the third sidewall spacers as an etching mask.

Another aspect of the present disclosure includes providing a semiconductor structure. The semiconductor structure may include a to-be-etched layer; a plurality of first sacrificial layers formed on the to-be-etched layer; and a plurality of third sidewall spacers formed on sidewall surfaces of the plurality of first sacrificial layers. The plurality of third sidewall spacers are formed by forming a first sacrificial film on the to-be-etched layer; and forming a plurality of discrete first sidewall spacers and a plurality of sidewall trenches on the first sacrificial film. Each of the plurality of sidewall trenches is located between two adjacent first sidewall spacers of the plurality of discrete first sidewall spacers; the plurality of first sidewall trenches include a first sidewall trench and a second sidewall trench; and a width of the second sidewall trench is greater than a width of the first sidewall trench. The method for forming the plurality of third sidewall spacers may also include forming a second sidewall spacer in the first sidewall trench to fill the first sidewall trench; and etching the first sacrificial film using the plurality of first sidewall spacers and the second sidewall spacer as an etching mask to form the plurality of discrete first sacrificial layers on the to-be-etched layer.

Comparing with the existing technologies, the technical solutions of the present disclosure may have at least the following beneficial effects.

In the disclosed fabrication method, in a multiple patterning process, a second sidewall spacer may be used to fill the first sidewall trench to merge the first sidewall spacers at two sides of the first sidewall trench. In the following pattern transfer process, and the portions of the to-be-etched layer corresponding to the merged first sidewall spacers and the second sidewall spacer may not form a fin. Thus, the process for subsequently removing a portion of the fins by a photolithography process may be omitted. Accordingly, the production time and the production cost may be reduced.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
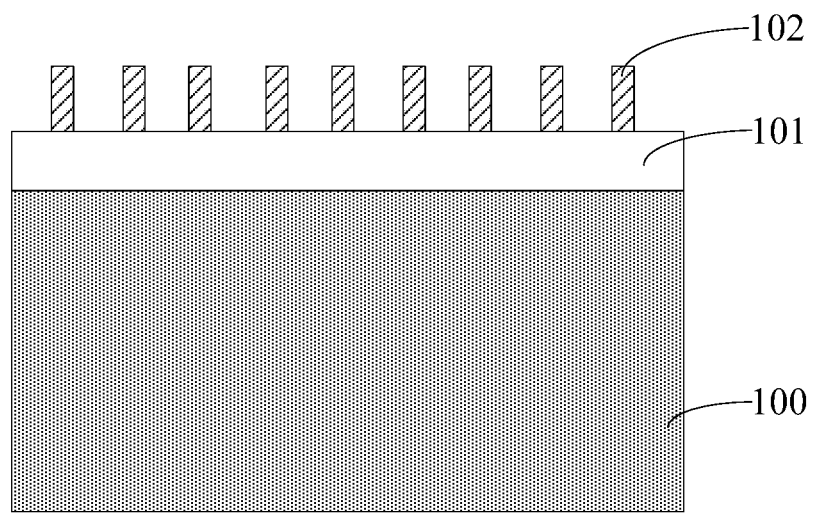
FIGS. 1-3 illustrate structures corresponding to certain stages during a fabrication process of a semiconductor structure.
Figure 2:
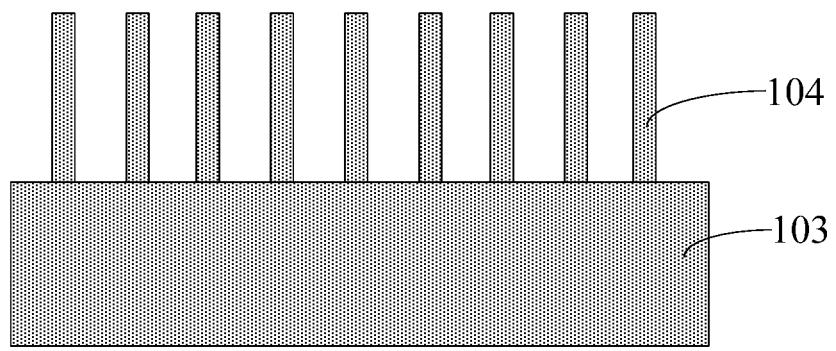
Figure 3:
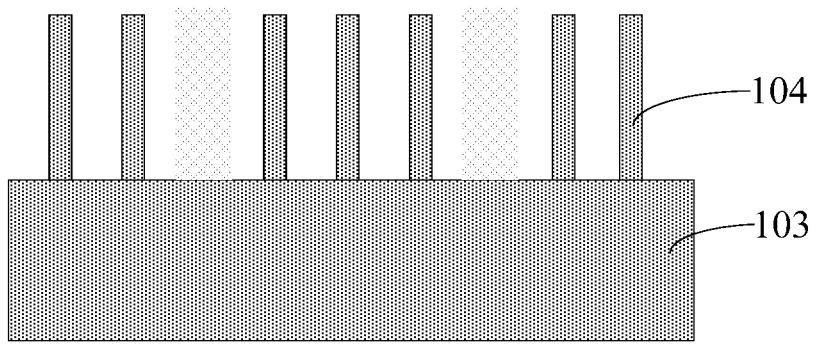

FIGS. 1-3 illustrate structures corresponding to certain stages during a fabrication process of a semiconductor structure.

As shown in FIG. 1, the fabrication process includes providing an initial substrate 100; forming a mask layer 101 on the initial substrate 100; and forming a plurality of discrete sacrificial layers 102 on the mask layer 101. The plurality of sacrificial layers 102 may be formed by a multiple patterning processes.

Further, as shown in FIG. 2, the mask layer 101 and the initial substrate 100 may be etched using the sacrificial layers 102 as a mask to form a substrate 103 and a plurality of discrete fins 104 on the substrate 103. After forming the substrate 103 and the plurality of fins 104, the sacrificial layer 102 and the mask layer 101 are removed.

Further, as shown in FIG. 3, a photolithography patterning process is used to remove a portion (a certain number) of the plurality of fins 104.

In such a fabrication process, after the fins 104 are formed, according to different design requirements, it is often necessary to remove the portion of the fins 104 to increase the distance between adjacent fins 104. In particular, after forming the fins 104, the portion of the fins 104 are removed by a photolithography patterning process. The method not only increases the production time, but also requires an additional mask during the process. Thus, it will also increase the production cost.

The present disclosure provides a semiconductor structure and a method for forming a semiconductor structure. In a multiple patterning process, a second sidewall spacer may be used to fill the first sidewall trench. In the subsequent pattern transfer process, the to-be-etched layer corresponding to such a position may not form a fin. Thus, the need to use a photolithography patterning process to remove a portion of the fins may be not required, and the manufacturing time and manufacturing cost may be reduced.

To make the above-mentioned objects, features and advantages of the present disclosure more obvious and understandable, specific embodiments of the present disclosure will be described in detail below with reference to the accompanying drawings.

Figure 13:
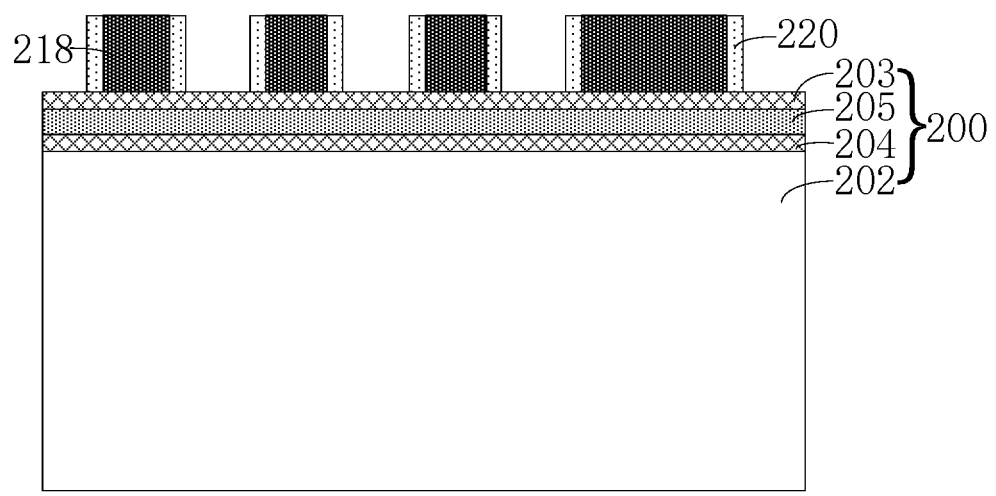
Figure 14:
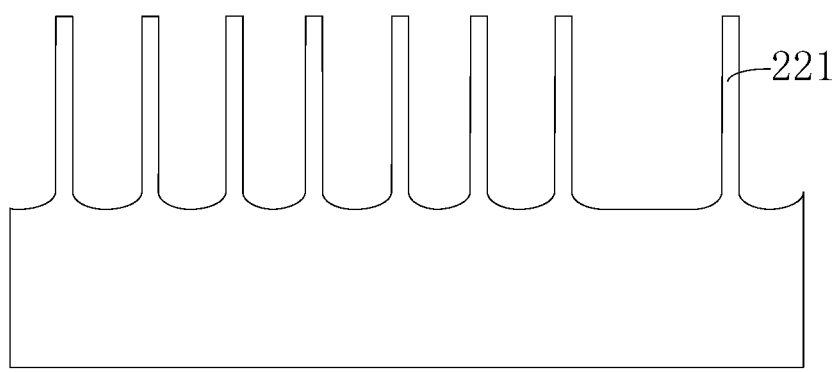
Figure 15:
FIG. 15 illustrates an exemplary fabrication process of a semiconductor structure consistent with various disclosed embodiments of the present disclosure.

FIG. 15 illustrates an exemplary fabrication process of a semiconductor structure consistent with various disclosed embodiments of the present disclosure. FIGS. 4-14 illustrate structures corresponding to certain stages during the exemplary fabrication process of the semiconductor structure.

Figure 4:
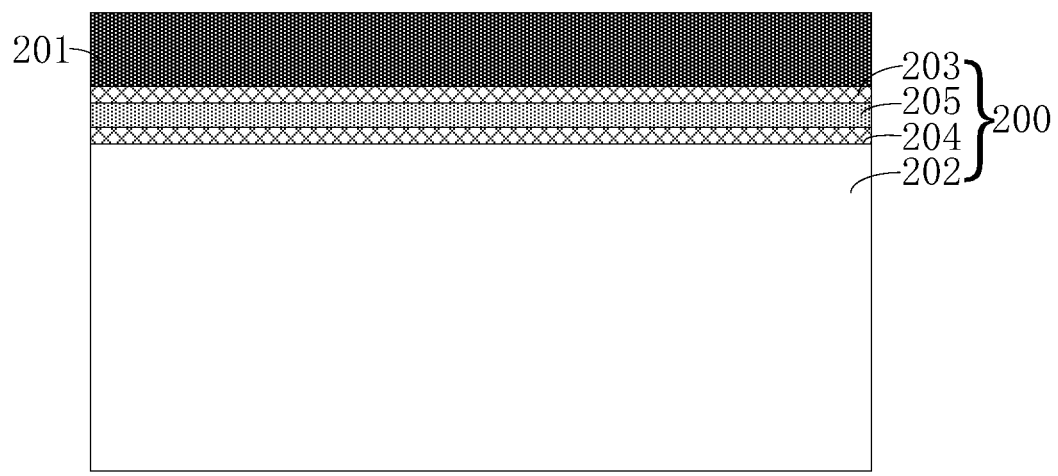
FIGS. 4-14 illustrate structures corresponding to certain stages during an exemplary fabrication process of a semiconductor structure consistent with various disclosed embodiments of the present disclosure.

As shown in FIG. 15, at the beginning of the fabrication process, a to-be-etched layer with certain structures is provided (S101). FIG. 4 illustrates a corresponding structure.

As shown in FIG. 4, a to-be-etched layer 200 is provided. A first sacrificial film 201 may be formed on the to-be-etched layer 200.

In one embodiment, the to-be-etched layer 200 may include a multiple-layer structure. The to-be-etched layer 200 may include a substrate 202, a mask structure on the substrate 202, and a first stop layer 203 on the mask structure.

In one embodiment, the substrate 202 may be made of silicon. In some embodiments, the material of the substrate may also be germanium, silicon germanium, silicon carbide, gallium arsenide, or indium gallium, etc.

In one embodiment, as shown in FIG. 4, the mask structure may include a first mask layer 204, and a second mask layer 205 formed on the first mask layer 204.

The material of the first mask layer 204 may be nitrogen-doped silicon oxycarbide. The first mask layer 204 made of nitrogen-doped silicon oxycarbide may have a desired bonding ability with the substrate 202. When the substrate 202 is subsequently etched using the etched first mask layer 204 as an etching mask, the first mask layer 204 may not be prone to peeling or warping. Thus, the first mask layer 204 may have a desired ability to maintain the etched patterns. Accordingly, it may be beneficial to make the morphology of the openings formed in the substrate 202 to be as desired, and the accuracy of the patterns after the etching process may be effectively improved.

The material of the second mask layer 205 may be titanium nitride. The bonding ability between the second mask layer 205 and the first mask layer 204 may be as desired. The second mask layer 205 may be able to protect the surface of the first mask layer 204 during subsequently etching the substrate 202 such that the first mask layer 204 may not be thinned. Further, the physical strength of the second mask layer 205 may be relatively large. Accordingly, in the subsequent process for etching the to-be-etched layer 200, the patterns of the second mask layer 205 and the first mask layer 204 may be kept stable; and the formation of the openings with desired morphologies may be facilitated.

In some embodiments, the mask structure may also be a single-layer structure.

In one embodiment, the material of the first sacrificial film 201 may be amorphous silicon. In some embodiments, the material of the first sacrificial film may also be silicon nitride, silicon carbide, silicon carbonitride, silicon carbon oxynitride, silicon oxide, silicon oxynitride, boron nitride, or boron carbonitride, etc.

A plurality of discrete first sidewall spacers and a plurality of sidewall trenches may be formed on the first sacrificial film 201, and each of the sidewall trenches may be located between adjacent first sidewall spacers. The plurality of sidewall trenches may include a first sidewall trench and a second sidewall trench, and the width of the second sidewall trench may be greater than the width of the first sidewall trench. FIGS. 5-8 illustrate structures corresponding certain stages during a fabrication process of the first sidewall spacers and the sidewall trenches.

Figure 5:
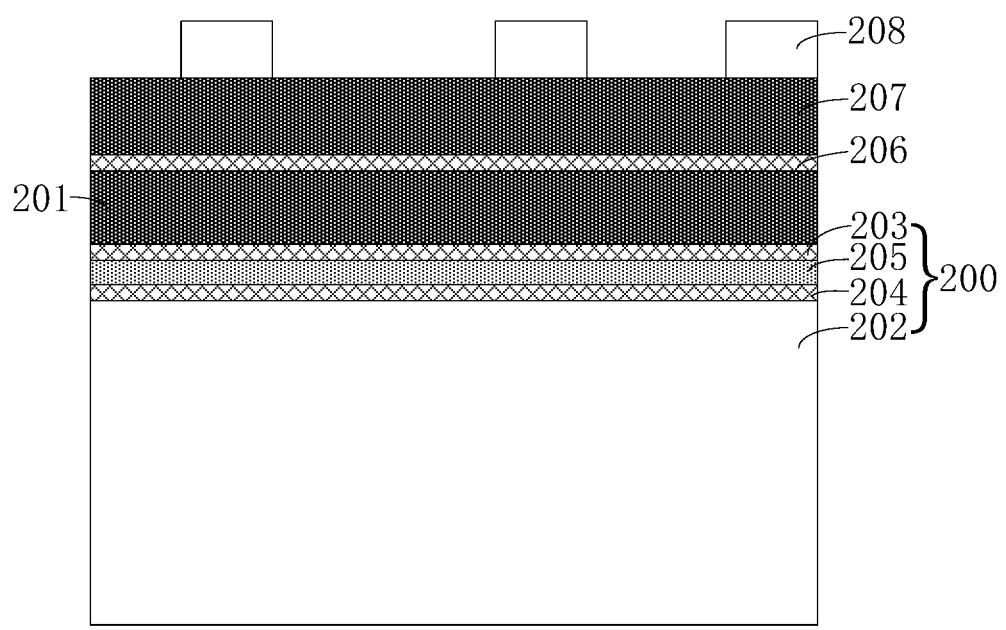

Returning to FIG. 15, after providing the to-be-etched layer, a second stop layer, a second sacrificial film and a plurality of discrete patterned structures may be formed (S102). FIG. 5 illustrates a corresponding structure.

As shown in FIG. 5, a second stop layer 206 may be formed on the first sacrificial film 201; a second sacrificial film 207 may be formed on the second stop layer 206; and a plurality of discrete patterned structures 208 may be formed on the second sacrificial film 207.

In one embodiment, the second stop layer 206 may be used to stop the etching process when the second sacrificial film 207 is subsequently etched to prevent the etching process from continuing to etch the first sacrificial film 201.

In one embodiment, the material of the second stop layer 206 may be different from the material of the second sacrificial film 207. The purpose for using different materials for the second stop layer 206 and the second sacrificial film 207 may be to stop the etching process on the surface of the second stop layer 206 when etching the second sacrificial film 207 in the subsequent etching process. The material of the second stop layer 206 may be silicon oxide, etc.

In one embodiment, the material of the second sacrificial film 207 may be amorphous silicon. In some embodiments, the material of the second sacrificial film may also be silicon nitride, silicon carbide, silicon carbonitride, silicon carbon oxynitride, silicon oxynitride, boron nitride, or boron carbonitride, etc.

In one embodiment, the material of the plurality of patterned structures 208 may be photoresist.

Figure 6:
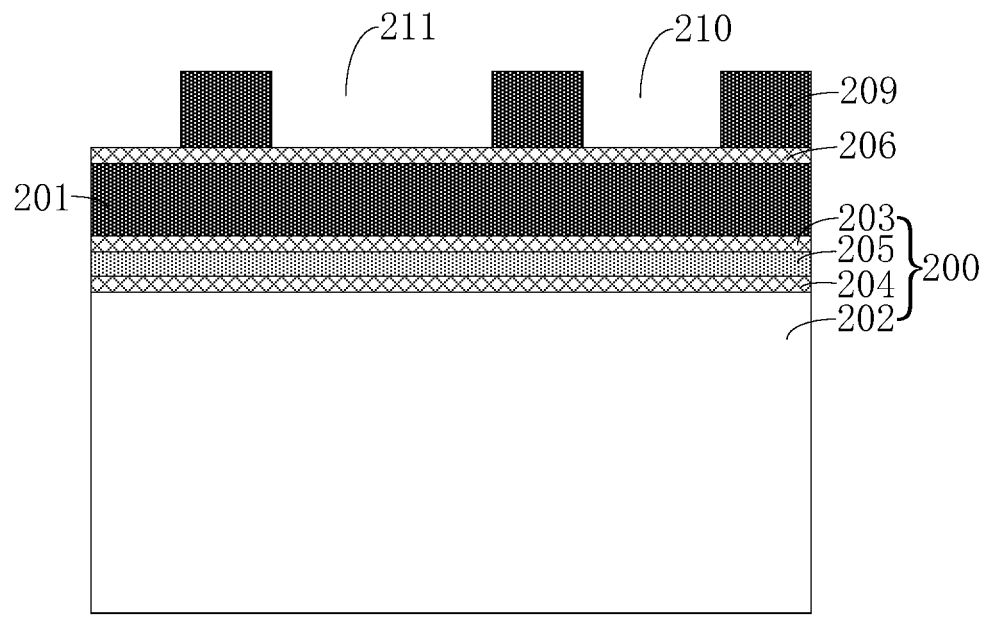

Returning to FIG. 15, after forming the plurality of patterned structures, a plurality of second sacrificial layers and a plurality of second sacrificial layer trenches may be formed (S103). FIG. 6 illustrates a corresponding structure.

As shown in FIG. 6, after forming the plurality of patterned structures 208, the second sacrificial film 207 may be etched using the plurality of patterned structures 208 as an etching mask until the second stop layer 206 is exposed to form a plurality of discrete second sacrificial layers 209 and a plurality of sacrificial layer trenches. Each of the plurality of sacrificial layer trenches may be located between two adjacent second sacrificial layers 209. The plurality of sacrificial layer trenches may include a first sacrificial layer trench 210 and a second sacrificial layer trench 211. The width of the second sacrificial layer trench 211 may be greater than the width of the first sacrificial layer trench 210. After forming the second sacrificial layers 209, the plurality of patterned structures 208 may be removed.

In one embodiment, the width direction of the first sacrificial layer trench 210 and the second sacrificial layer trench 211 may be a direction parallel to the top surface of the second stop layer 206.

The process for forming the patterned structures 208 may include a photolithography patterning process. The process for removing the patterned structures 208 may include a wet stripping process or an ashing process, etc. In one embodiment, the process for removing the patterned structures 208 is an ashing process, and the gas of the ashing process may be an oxygen-containing gas, such as oxygen, or ozone, etc.

Figure 7:
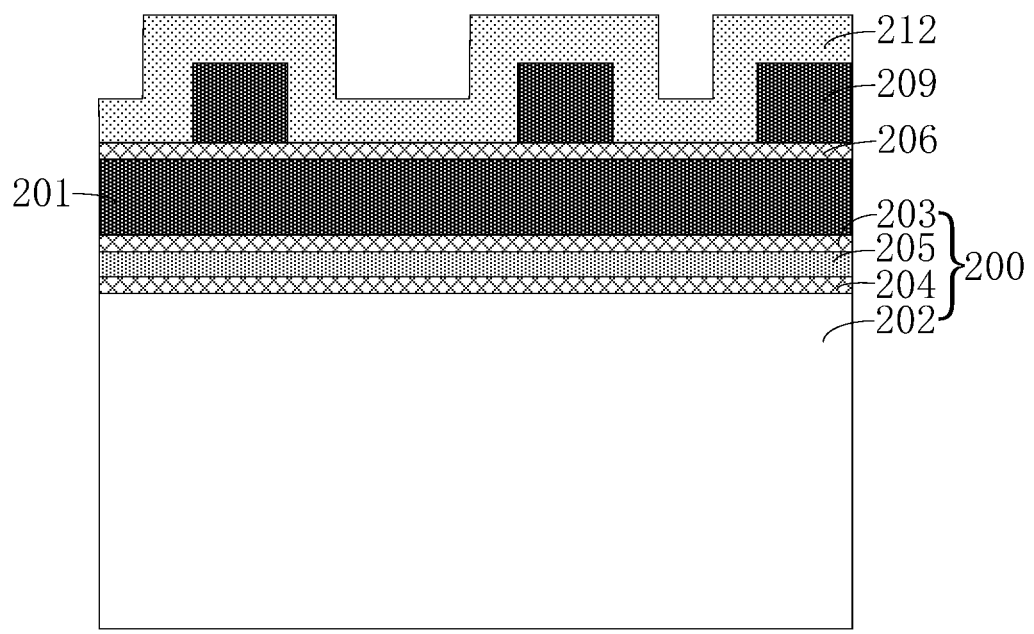

Returning to FIG. 15, after forming the plurality of sacrificial layer trenches, a first sidewall spacer film may be formed (S104). FIG. 7 illustrates a corresponding structure.

As shown in FIG. 7, after removing the patterned structures 208, a first sidewall film 212 may formed on the exposed portions of the top surface of the second stop layer 206, and the sidewall surfaces and the top surfaces of the second sacrificial layers 209.

The first sidewall film 212 may be formed by any appropriate process. In one embodiment, the process for forming the first sidewall film 212 may include an atomic layer deposition (ALD) process. The first sidewall film 212 formed by the ALD process may have a better step coverage. Further, the thickness of the first sidewall film 212 may be more uniform, and may be easy to control.

The material of the first sidewall film 212 may include silicon nitride, or silicon oxynitride, etc. In one embodiment, the material of the first sidewall film 212 is silicon nitride.

Figure 8:
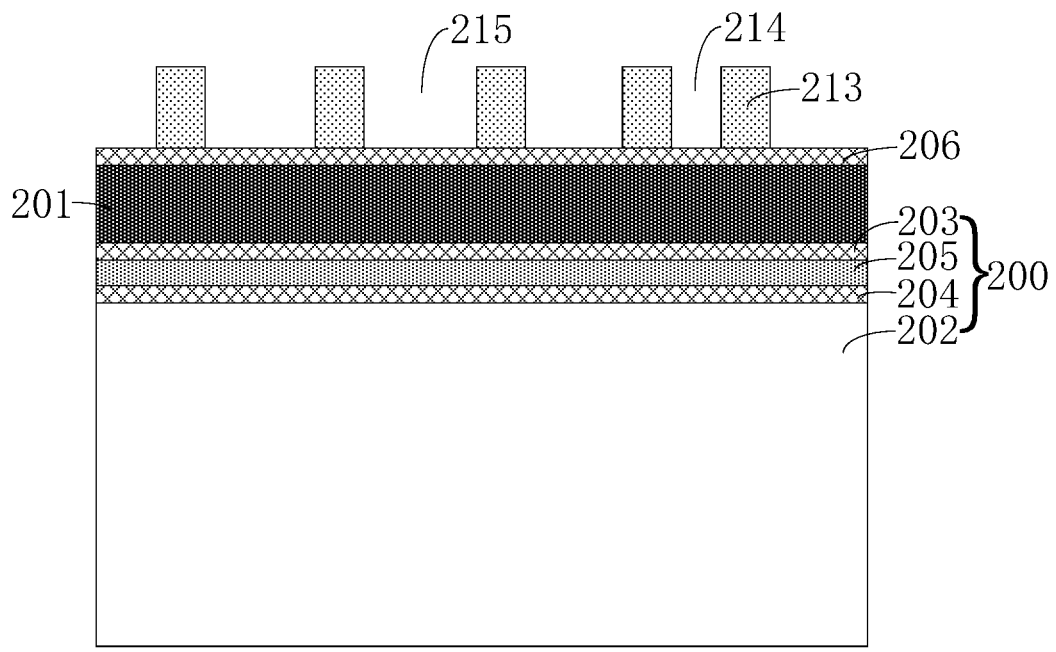

Returning to FIG. 15, after forming the first sidewall film, first sidewall spacers and sidewall trenches may be formed (S105). FIG. 8 illustrates a corresponding structure.

As shown in FIG. 8, after forming the sidewall film 212, the sidewall film 212 on the top surface of the second stop layer 206 and the first sidewall film 212 on the top surfaces of the second sacrificial layers 209 may be etched back until the top surface of the second stop layer 206 and the top surfaces of the second sacrificial layers 209 are exposed to form a plurality of first sidewall spacers 213. Further, the second sacrificial layers 209 may be removed to form a plurality of sidewall trenches. Each sidewall trench may be located between two adjacent first sidewall spacers 213. The plurality of sidewall trenches may include a first sidewall trench 214 and a second sidewall trench 215. The width of the second sidewall trench 215 may be greater than the width of the first sidewall trench 214.

In one embodiment, the width direction of the first sidewall trench 214 and the second sidewall trench 215 may be a direction parallel to the top surface of the second stop layer 206.

In one embodiment, in particular, the plurality of discrete first sidewall spacers 213 and the plurality of the sidewall trenches may be formed on the second stop layer 206.

The process used for etching back the first sidewall film 212 may include an anisotropic dry etching process or an anisotropic wet etching process, etc. In one embodiment, the process used to etch back the first sidewall film 212 is an anisotropic dry etching process. The etching gas may include one or more of fluorine-containing gases, such as $CF_4$, $CHF_3$, or $C_2F_6$, etc.

In one embodiment, the ratio between the width of the first sacrificial layer trench 210 and the thickness of the first sidewall spacer 213 may be greater than 2:1. The ratio between the width of the second sacrificial layer trench 211 and the thickness of the first sidewall spacer 213 may be greater than 2:1. The thickness direction of the first sidewall spacer 213 may be a direction parallel to the top surface of the second stop layer 206.

By setting the widths of the first sacrificial layer trench 210 and the second sacrificial layer trench 211 to be greater than twice the thickness of the first sidewall spacer 213, the overall width of the first sidewall spacer 213 and the second sidewall spacer subsequently formed in the first sacrificial layer 210 may be effectively enlarged. The need for an additional trimming in the subsequent process when the widths of the first sacrificial layer trench 210 and the second sacrificial layer trench 211 are relatively small may be avoided; and the production efficiency may be improved.

Figure 9:
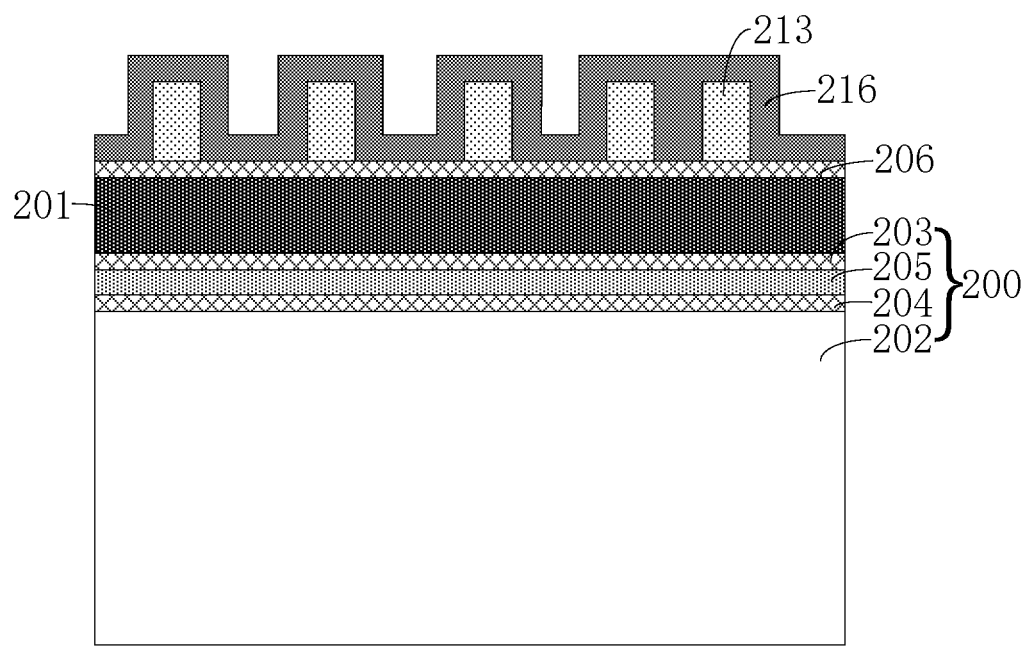
Figure 10:
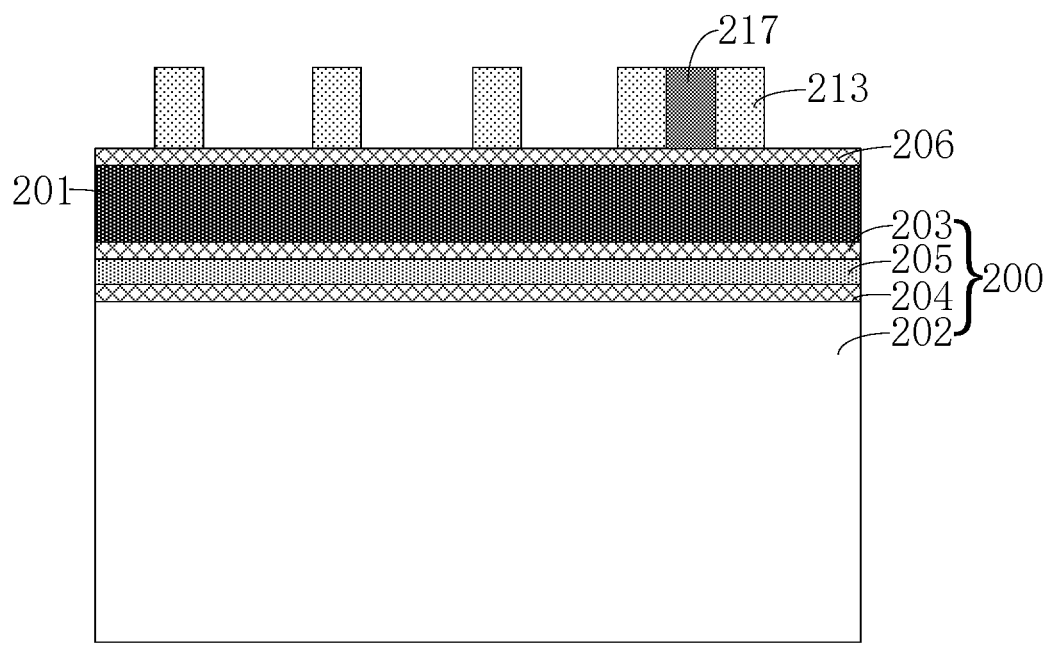

In one embodiment, after forming the first sidewall spacers 213, a second sidewall spacer may be subsequently formed in the first sidewall trench 214. The second sidewall spacer may fill the first sidewall trench 214. FIGS. 9-10 illustrate structures corresponding to certain stages during a process for forming the second sidewall spacer.

Returning to FIG. 15, after forming the first sidewall spacers, a second sidewall film may be formed (S106). FIG. 9 illustrates a corresponding structure.

As shown in FIG. 9, a second sidewall film 216 may be formed on the exposed portions of the top surface of the second stop layer 206 and the sidewall surfaces and the top surfaces of the first sidewall spacers 213.

In one embodiment, the second stop layer 206 may also be used to subsequently stop etching the second sidewall film 216 to prevent the etching process from continuing to damage the first sacrificial film 201.

In one embodiment, the process for forming the second sidewall film 216 may include an atomic layer deposition (ALD) process, etc.

In one embodiment, the material of the second sidewall film 216 may be different from the material of the first sidewall film 212. Such an arrangement may prevent the subsequent etching process of the second sidewall film 216 from damaging the first sidewall spacers 213. The material of the second sidewall film 216 may be silicon carbonitride, etc.

Returning to FIG. 15, after forming the second sidewall film, a second sidewall spacer may be formed (S107). FIG. 10 illustrates a corresponding structure.

As shown in FIG. 10, the second sidewall film 216 on the surface of the second sidewall trench 215 and the top surfaces of the first sidewall spacers 213 may be etched until the top surface of the second stop layer 206 and the top surfaces of the first sidewall spacers 213 are exposed to form the second sidewall spacer 217.

In one embodiment, the ratio between the width of the first sidewall trench 214 and the thickness of the second sidewall spacer 217 may be less than 2:1, and the ratio between the width of the second sidewall trench 215 and the thickness of the second sidewall spacer 217 may be greater than 2:1. The thickness direction of the second sidewall spacer 217 may be a direction parallel to the second stop layer 206.

By setting the width of the first sidewall trench 214 to be less than twice the thickness of the second sidewall spacer 217, while the width of the second sidewall trench 215 may be set to be greater than twice the thickness of the second sidewall spacer 217, it may ensure that, after etching the second sidewall film 216, the formed second sidewall spacer 217 may fill the first sidewall trench 214 and may not be formed in the second sidewall trenches 215. Accordingly, the second sidewall spacer 217 may be merged with the first sidewall spacers 213 on both sides of the first sidewall trench 214. In the subsequent pattern transfer process, the portion of the to-be-etched layer 200 corresponding to the merged first sidewall spacers 213 and the second sidewall spacer 217 may not form a fin. Thus, there may be no need to use a photolithography patterning process to remove a portion of the fins; and the production time and the production cost may be reduced.

The process used to etch the second sidewall film 216 may include an isotropic dry etching process, or an isotropic wet etching process, etc. In one embodiment, the process used for etching the second sidewall film 216 may include an isotropic dry etching process. The parameters of the isotropic dry etching process may include a following combination. The etching gas may include $CF_4$, $CHF_3$, $O_2$, and $N_2$, etc. The flow rate of $CF_4$ may be in a range of approximately 50 sccm-500 sccm; the flow rate of $CHF_3$ may be in a range of approximately 0 sccm-200 sccm; the flow rate $O_2$ may be in a range of approximately 0 sccm-100 sccm; and the flow rate of $N_2$ may be in a range of approximately 0 sccm-200 sccm.

Figure 11:
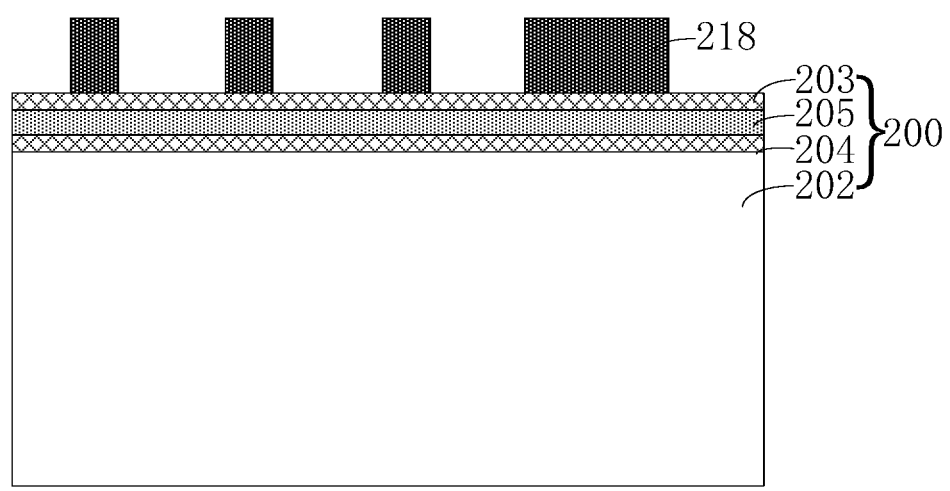

Returning to FIG. 15, after forming the second sidewall spacer, a plurality of first sacrificial layers may be formed (S108). FIG. 11 illustrates a corresponding structure.

As shown in FIG. 11, the first sacrificial film 201 may be etched using the first sidewall spacers 213 and the second sidewall spacer 217 as an etching mask to form a plurality of first sacrificial layers 218 on the to-be-etched layer 200.

In one embodiment, after forming the plurality of first sacrificial layers 218, the method may further include removing the first sidewall spacers 213, the second sidewall spacer 217, and the second stop layer 206.

Figure 12:
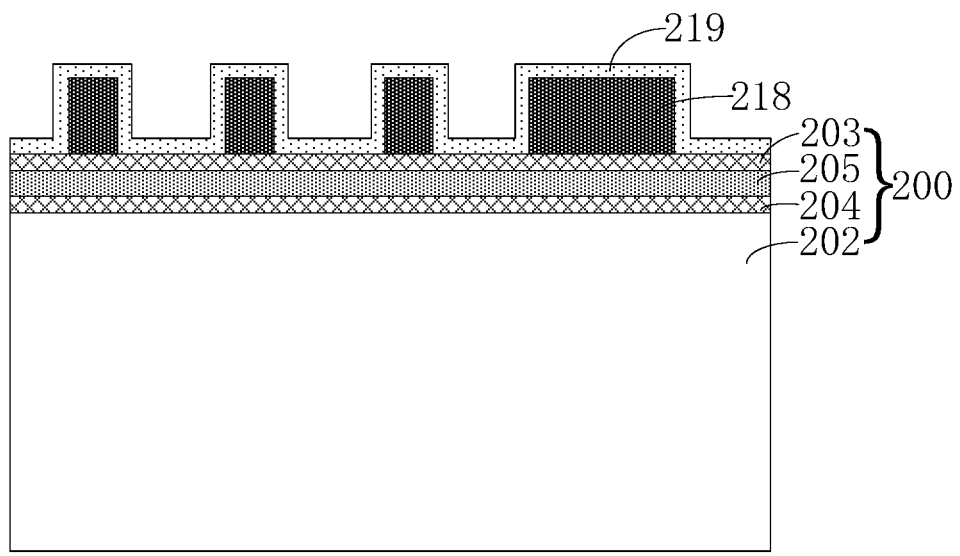

After removing the first sidewall spacers 213, the second sidewall spacer 217, and the second stop layer 206, third sidewall spacers may be subsequently formed on the sidewall surfaces of the first sacrificial layers 218 to form third sidewall spacers. FIGS. 12-13 illustrate structures corresponding to certain stages during the process for forming third sidewall spacers.

Returning to FIG. 15, after forming the plurality of first sacrificial layers, a third sidewall film may be formed (S109). FIG. 12 illustrates a corresponding structure.

As shown in FIG. 12, a third sidewall film 219 may be formed on the exposed portions of the top surface of the to-be-etched layer 200 and the sidewall surfaces and the top surfaces of the first sacrificial layers 218.

In one embodiment, the process for forming the third sidewall film 219 may include an atomic layer deposition (ALD) process.

The material of the third sidewall film 219 may include silicon nitride, or silicon oxynitride, etc. In one embodiment, the material of the third sidewall film 219 is silicon nitride.

Returning to FIG. 15, after forming the third sidewall film, a plurality of third sidewall spacers may be formed (S110). FIG. 13 illustrates a corresponding structure.

As shown in FIG. 13, the third sidewall film 219 on the exposed portions of the top surface of the to-be-etched layer 200 and the top surfaces of the first sacrificial layers 218 may be etched back until the top surface of the to-be-etched layer 200 and the top surfaces of the first sacrificial layers 218 are exposed to form a plurality of third sidewall spacers 220.

In one embodiment, the etching-back process of the third sidewall film 219 may specifically be stopped at the first stop layer 203. Thus, the material of the first stop layer 203 may different from the material of the third sidewall film 219. The material of the first stop layer 203 may be silicon oxide.

The process used to etch the third sidewall film 219 may include an anisotropic dry etching process or an anisotropic wet etching process. In one embodiment, the process used to etch the third sidewall film 219 is an anisotropic dry etching process.

Returning to FIG. 15, after forming the third sidewall spacers, a plurality of fins may be formed (S111). FIG. 14 illustrates a corresponding structure.

As shown in FIG. 14, after forming the third sidewall spacers 220, the first sacrificial layers 218 may be removed. Then, the to-be-etched layer 200 may be etched using the third sidewall spacers 220 as an etching mask to form a plurality of discrete fins 221.

In this embodiment, the plurality of fins 221 may be formed in the substrate 202. the plurality of fins 221 may be used to subsequently form semiconductor devices.

The plurality of fins 221 formed by using the third sidewall spacers 220 as the etching mask may have different spacings to meet the subsequent fabrication requirements of semiconductor devices.

In one embodiment, referring to FIG. 14, after forming the plurality of fins 221, the third sidewall spacers 220, the first stop layer 203, and the mask structure may be removed.

The present disclosure also provides a semiconductor structure. FIG. 13 illustrates a corresponding structure.

As shown in FIG. 13, the semiconductor structure includes a to-be-etched layer 200 and a plurality of first sacrificial layers 218 formed on the to-be-etched layer 200. The semiconductor structure may also include a plurality of third sidewall spacers 220 formed on the sidewall surfaces of the first sacrificial layers 218. The to-be-etched layer 200 may include a substrate 202, a mask structure including a first mask layer 204 and a second mask layer 205 on the substrate 202, and a first stop layer 203 on the mask structure. The detailed structures and intermediate structures are described above with respect to the fabrication processes.

The technical solutions of the present disclosure may have at least the following beneficial effects.

In the disclosed fabrication method, in a multiple patterning process, a second sidewall spacer may be used to fill the first sidewall trench to merge the first sidewall spacers at two sides of the first sidewall trench. In the following pattern transfer process, and the portion of the to-be-etched layer corresponding to the merged first sidewall spacers and the second sidewall spacers may not form a fin. Thus, the process for subsequently removing a portion of the fins by a photolithography process may be omitted. Accordingly, the production time and the production cost may be reduced.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method for fabricating a semiconductor structure, comprising:
    providing a to-be-etched layer;
    forming a first sacrificial film on the to-be-etched layer;
    forming a plurality of discrete first sidewall spacers and a plurality of sidewall trenches, on the first sacrificial film, wherein each of the plurality of sidewall trenches is located between adjacent first sidewall spacers of the plurality of discrete first sidewall spacers, the plurality of sidewall trenches include a first sidewall trench and a second sidewall trench, and a width of the second sidewall trench is greater than a width of the first sidewall trench;
    forming a second sidewall spacer in the first sidewall trench to completely fill up the first sidewall trench; and
    etching the first sacrificial film using the plurality of first sidewall spacers and the second sidewall spacer as an etching mask to form a plurality of discrete first sacrificial layers on the to-be-etched layer.

2. The method according to claim 1, wherein:
the to-be-etched layer includes a multiple-layer structure, the multiple-layer structure including a substrate, a mask structure on the substrate and a first stop layer on the mask structure.

3. The method according to claim 1, after forming the plurality of first sacrificial layers, further comprising:
removing the second sidewall spacer and the plurality of first sidewall spacers.

4. A method for fabricating a semiconductor structure, comprising:
providing a to-be-etched layer, wherein the to-be-etched layer includes a multiple-layer structure, the multiple-layer structure including a substrate, a mask structure on the substrate and a first stop layer on the mask structure;
forming a first sacrificial film on the to-be-etched layer;
forming a plurality of discrete first sidewall spacers and a plurality of sidewall trenches, on the first sacrificial film, wherein each of the plurality of sidewall trenches is located between adjacent first sidewall spacers of the plurality of discrete first sidewall spacers, the plurality of sidewall trenches include a first sidewall trench and a second sidewall trench, and a width of the second sidewall trench is greater than a width of the first sidewall trench;
forming a second sidewall spacer in the first sidewall trench to fill the first sidewall trench; and
etching the first sacrificial film using the plurality of first sidewall spacers and the second sidewall spacer as an etching mask to form a plurality of discrete first sacrificial layers on the to-be-etched layer, wherein forming the plurality of first sidewall spacers comprises:
forming a second stop layer on the first sacrificial film;
forming a plurality of discrete second sacrificial layers and a plurality of sacrificial layer trenches on the second stop layer, wherein:
each of the plurality of sacrificial layer trenches is located between two adjacent second sacrificial layers of the plurality of discrete second sacrificial layers;
the plurality of sacrificial layer trenches include a first sacrificial layer trench and a second sacrificial layer trench; and
a width of the second sacrificial layer trench is greater than a width of the first sacrificial layer trench;
forming a first sidewall spacer on a sidewall surface of a second sacrificial layer of the plurality of discrete second sacrificial layers; and
removing the plurality of discrete second sacrificial layers after forming the first sidewall spacer.

5. The method according to claim 4, wherein forming the first sidewall spacer on the sidewall surface of the second sacrificial layer comprises:
forming a first sidewall film on exposed portions of a top surface of the second stop layer, and sidewall surfaces and top surfaces of the plurality of discrete second sacrificial layers;
etching-back the first sidewall film on the exposed portions of the top surface of the second stop layer and the top surfaces of the plurality of discrete second sacrificial layers until the exposed portions of the top surface of the second stop layer and the top surfaces of the plurality of discrete second sacrificial layers are exposed to form the first sidewall spacer on the sidewall surface of the second sacrificial layer.

6. The method according to claim 5, wherein:
forming the first sidewall film includes an atomic layer deposition process.

7. The method according to claim 5, wherein:
etching-back the first sidewall film includes one or more of an anisotropic dry etching process and an anisotropic wet etching process.

8. The method according to claim 5, wherein:
a material of the first sidewall film includes one or more of silicon nitride and silicon oxynitride.

9. The method according to claim 4, wherein:
a ratio between the width of the first sacrificial layer trench and a thickness of the first sidewall spacer is greater than 2:1; and
a ratio between the width of the second sacrificial layer trench and the thickness of the first sidewall spacer is greater than 2:1.

10. The method according to claim 4, wherein forming the plurality of discrete second sacrificial layers comprises:
forming a second sacrificial film on the second stop layer;
forming a plurality of discrete patterned structures on the second sacrificial film;
etching the second sacrificial film using the plurality of discrete patterned structures as an etching mask until the second stop layer is exposed to form the plurality of discrete second sacrificial layers; and
removing the plurality of discrete patterned structures after forming the plurality of discrete second sacrificial layers.

11. The method according to claim 4, wherein forming the second sidewall spacer comprises:
forming a second sidewall film on exposed portions of a top surface of the second stop layer and sidewall surfaces and top surfaces of the plurality of first sidewall spacers; and
etching the second sidewall film on surfaces of the second sidewall trench and the top surfaces of the plurality of first sidewall spacers until the top surface of the second stop layer and the top surfaces of the plurality of first sidewall spacers are exposed to form the second sidewall spacer.

12. The method according to claim 11, wherein:
a ratio between the width of the first sidewall trench and a thickness of the second sidewall spacer is smaller than 2:1; and
a ratio between the width of the second sidewall trench and the thickness of the second sidewall spacer is greater than 2:1.

13. The method according to claim 11, wherein:
forming the second sidewall film includes an atomic layer deposition process.

14. The method according to claim 11, wherein:
etching the second sidewall film includes one or more of an isotropic dry etching process and an isotropic wet etching process.

15. The method according to claim 11, wherein:
a material of the second sidewall film includes silicon carbonitride.

16. A method for fabricating a semiconductor structure, comprising:
providing a to-be-etched layer;
forming a first sacrificial film on the to-be-etched layer;
forming a plurality of discrete first sidewall spacers and a plurality of sidewall trenches, on the first sacrificial film, wherein each of the plurality of sidewall trenches is located between adjacent first sidewall spacers of the plurality of discrete first sidewall spacers, the plurality of sidewall trenches include a first sidewall trench and a second sidewall trench, and a width of the second sidewall trench is greater than a width of the first sidewall trench;

forming a second sidewall spacer in the first sidewall trench to fill the first sidewall trench;

etching the first sacrificial film using the plurality of first sidewall spacers and the second sidewall spacer as an etching mask to form a plurality of discrete first sacrificial layers on the to-be-etched layer; and forming third sidewall spacers on the sidewall surfaces of the plurality of first sacrificial layers by:
    forming a third sidewall film on exposed portions of a top surface of the to-be-etched layer, and sidewall surfaces and top surfaces of the plurality of first sacrificial layers;
    etching-back the third sidewall film on the exposed portions of the top surface of the to-be-etched layer and the top surfaces of the plurality of first sacrificial layers until the exposed portions of the top surface of the to-be-etched layer and the top surfaces of the first sacrificial layers are exposed to form the third sidewall spacers; and
    removing the plurality of first sacrificial layers after forming the third sidewall spacers.

17. The method according to claim 16, wherein:
forming the third sidewall film includes an atomic layer deposition process.

18. The method according to claim 16, wherein:
a material of the third sidewall film includes one or more of silicon nitride and silicon oxynitride.

19. The method according to claim 16, after forming the third sidewall spacers, further comprising:
    forming a plurality of discrete fins by etching the to-be-etched layer using the third sidewall spacers as an etching mask.

* * * * *